(12) United States Patent
Hao et al.

(10) Patent No.: US 7,785,418 B2
(45) Date of Patent: Aug. 31, 2010

(54) ADJUSTING MECHANISM AND ADJUSTING METHOD THEREOF

(75) Inventors: Hung-Hu Hao, Hsin-chu (TW); Kuo-Pang Tseng, Hsin-chu (TW)

(73) Assignee: Macronix International Co., Ltd., Hsinchu (TW)

( * ) Notice: Subject to any disclaimer, the term of this patent is extended or adjusted under 35 U.S.C. 154(b) by 762 days.

(21) Appl. No.: 11/318,495

(22) Filed: Dec. 28, 2005

(65) Prior Publication Data
US 2007/0144435 A1  Jun. 28, 2007

(51) Int. Cl.
| | |
|---|---|
| C23C 16/00 | (2006.01) |
| B21D 53/02 | (2006.01) |
| B21D 39/06 | (2006.01) |
| B21D 53/00 | (2006.01) |
| B21D 39/03 | (2006.01) |
| B23P 11/00 | (2006.01) |
| B25B 27/14 | (2006.01) |

(52) U.S. Cl. ............... 118/715; 29/890.03; 29/890.036; 29/428; 29/281.5
(58) Field of Classification Search .................. 118/715; 29/890.03, 890.036, 428, 281.5
See application file for complete search history.

(56) References Cited

U.S. PATENT DOCUMENTS 3,911,786 A * 10/1975 Scheetz et al. ............... 89/1.51
4,936,004 A * 6/1990 Vaughn ....................... 29/271
5,902,103 A  5/1999 Maeda et al.
6,223,096 B1* 4/2001 Nam et al. ................... 700/213
6,394,753 B1* 5/2002 Maki et al. ............... 416/146 R

FOREIGN PATENT DOCUMENTS

JP  2003-243310  8/2003

* cited by examiner

Primary Examiner—Michael Cleveland
Assistant Examiner—Keath T Chen
(74) Attorney, Agent, or Firm—Birch, Stewart, Kolasch & Birch, LLP (57) ABSTRACT

An adjusting mechanism adjusts a boat to be parallel to a furnace having an opening and a receiving space, which has a first symmetrical line. When the boat having a second symmetrical line is inserted into the space, a first gap area is formed between sidewalls of the space and the boat. The mechanism includes an adjusting element and an adjusting tool, which is removably disposed in the opening and has a wide part, a narrow part and a through hole. The narrow part blocks the opening. When the boat is inserted into the space, a second gap area smaller than the first gap area is formed between the sidewalls of the boat and the through hole at the narrow part. The adjusting element adjusts the first and second symmetrical lines to be parallel to each other according to the second gap area.

10 Claims, 11 Drawing Sheets

ADJUSTING MECHANISM AND ADJUSTING METHOD THEREOF

BACKGROUND OF THE INVENTION

1. Field of the Invention

The invention relates in general to an adjusting mechanism and an adjusting method thereof, and more particularly to an adjusting mechanism using an adjusting tool to reduce a gap area between a boat and a furnace such that the boat in the furnace is parallel to the furnace, and an adjusting method thereof.

2. Description of the Related Art

In semiconductor manufacturing processes, a furnace is an important apparatus. The furnace provides a high-temperature environment for wafers such that various semiconductor manufacturing processes, such as oxidation, diffusion, doping, pre-deposition, drive-in, annealing, post-implantation annealing, heat treatment, reflow or high-temperature chemical vapor deposition (CVD), may be performed on the wafers.

The conventional furnace has a receiving space and an opening. The receiving space provides an airtight high-temperature environment. Several wafers are carried on a boat. The semiconductor manufacturing processes can be performed after the boat enters the receiving space through the opening. At this time, the furnace is heated such that the temperature rises to the desired temperature, and the boat is rotated such that the wafers are heated evenly.

However, if the boat is not parallel to the furnace, the boat may collide with an inner wall of the furnace to produce particles when the boat is rotated or moved into or out of the furnace. In a serious condition, the boat or the furnace may be damaged. In the semiconductor manufacturing processes, the tiny particles contaminate the wafer to produce defects in the wafer because the line width of the circuit in the wafer is very tiny.

Thus, it is an important subject of the invention to provide a method of ensuring the boat to be parallel to the furnace and thus solving the above-mentioned problem.

SUMMARY OF THE INVENTION

It is therefore an object of the invention to provide an adjusting mechanism using an adjusting tool for reducing a gap area between a boat and a furnace, and an adjusting method thereof. Thus, it is easier to adjust the boat in the furnace to be parallel to the furnace according to the gap area between the boat and the furnace. Consequently, it is possible to prevent the boat from colliding with the furnace when the boat is rotated or moved into and out of the furnace, and thus prevent the boat or the furnace from being damaged and prevent the particles, which contaminate the wafer and cause defects in the wafer, from being produced at the collision.

The invention achieves the above-identified object by providing an adjusting mechanism for adjusting a boat in a furnace to be parallel to the furnace. The furnace has a receiving space and an opening. The receiving space has a first symmetrical line. The boat has a second symmetrical line. A first gap area is formed between a sidewall of the receiving space and a sidewall of the boat when the boat is inserted into the receiving space through the opening. The adjusting mechanism includes an adjusting tool and an adjusting element. The adjusting tool is removably disposed at the opening and has a wide part, a narrow part and a through hole formed from the wide part to the narrow part. The narrow part blocks the opening such that the wide part is exposed out of the opening. A second gap area smaller than the first gap area is formed between a sidewall of the through hole at the narrow part and the sidewall of the boat when the boat is inserted into the receiving space through the through hole and the opening. The adjusting element adjusts the first symmetrical line and the second symmetrical line to be parallel to each other according to the second gap area.

The invention also achieves the above-identified object by providing an adjusting method of adjusting a boat in a furnace to be parallel to the furnace. The furnace has an opening, a receiving space and a first symmetrical line. The boat has a second symmetrical line, a first gap area being formed between a sidewall of the receiving space and a sidewall of the boat when the boat is inserted into the receiving space through the opening. The adjusting method includes the steps of: providing an adjusting tool, which has a wide part, a narrow part and a through hole formed from the wide part to the narrow part; using the narrow part to block the opening such that the wide part is exposed out of the opening; inserting the boat into the receiving space through the through hole and the opening to form a second gap area, which is smaller than the first gap area and located between the sidewall of the boat and a sidewall of the through hole at the narrow part; and adjusting the first symmetrical line and the second symmetrical line to be parallel to each other according to the second gap area.

The invention further achieves the above-identified object by providing a tool including a wide part and a narrow part. The narrow part is connected to the wide part. A through hole passing through the wide part and the narrow part is formed from the wide part to the narrow part. The tool has a width gradually decreasing from the wide part to the narrow part.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1A:
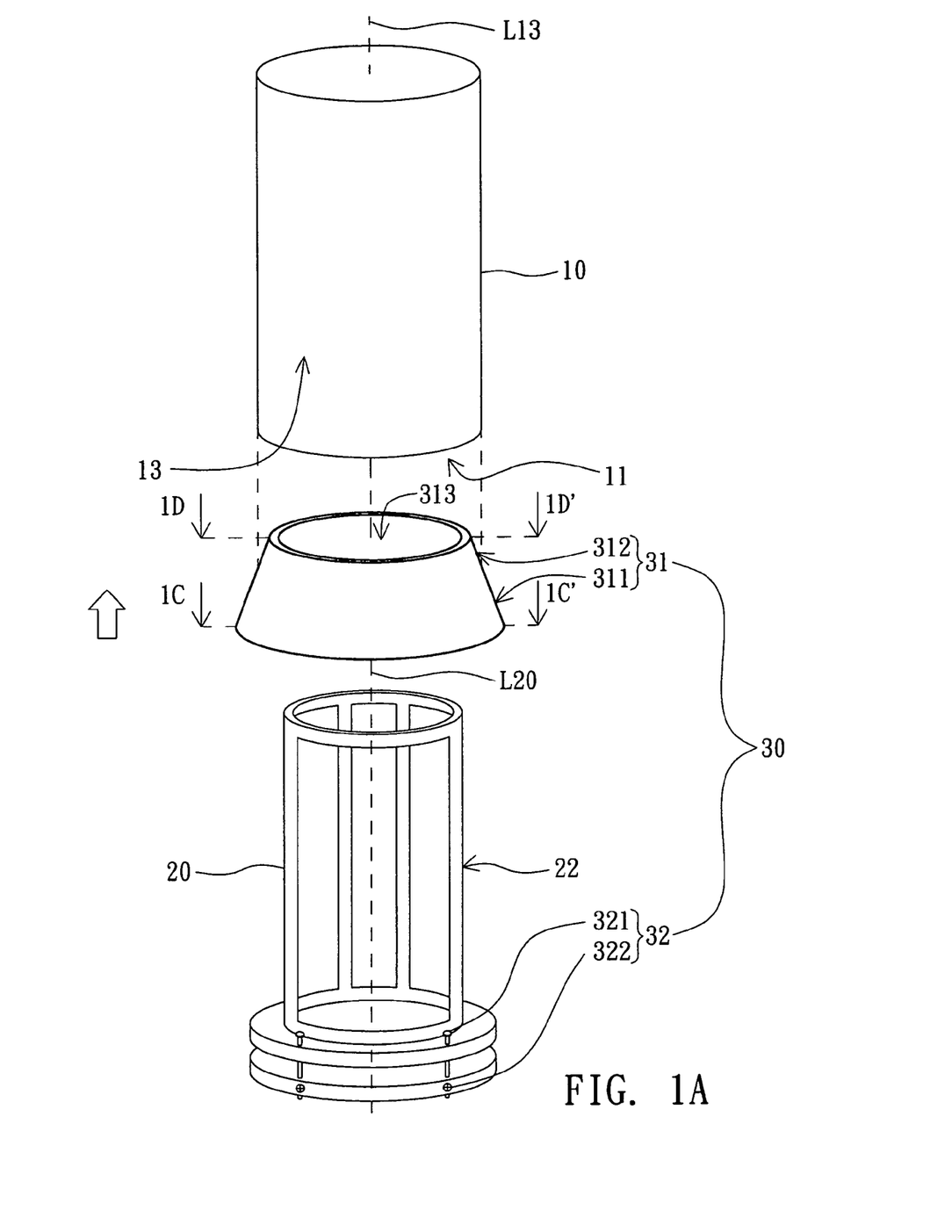
FIG. 1A is a pictorial view showing an adjusting mechanism, a furnace and a boat according to a preferred embodiment of the invention.
Figure 1B:
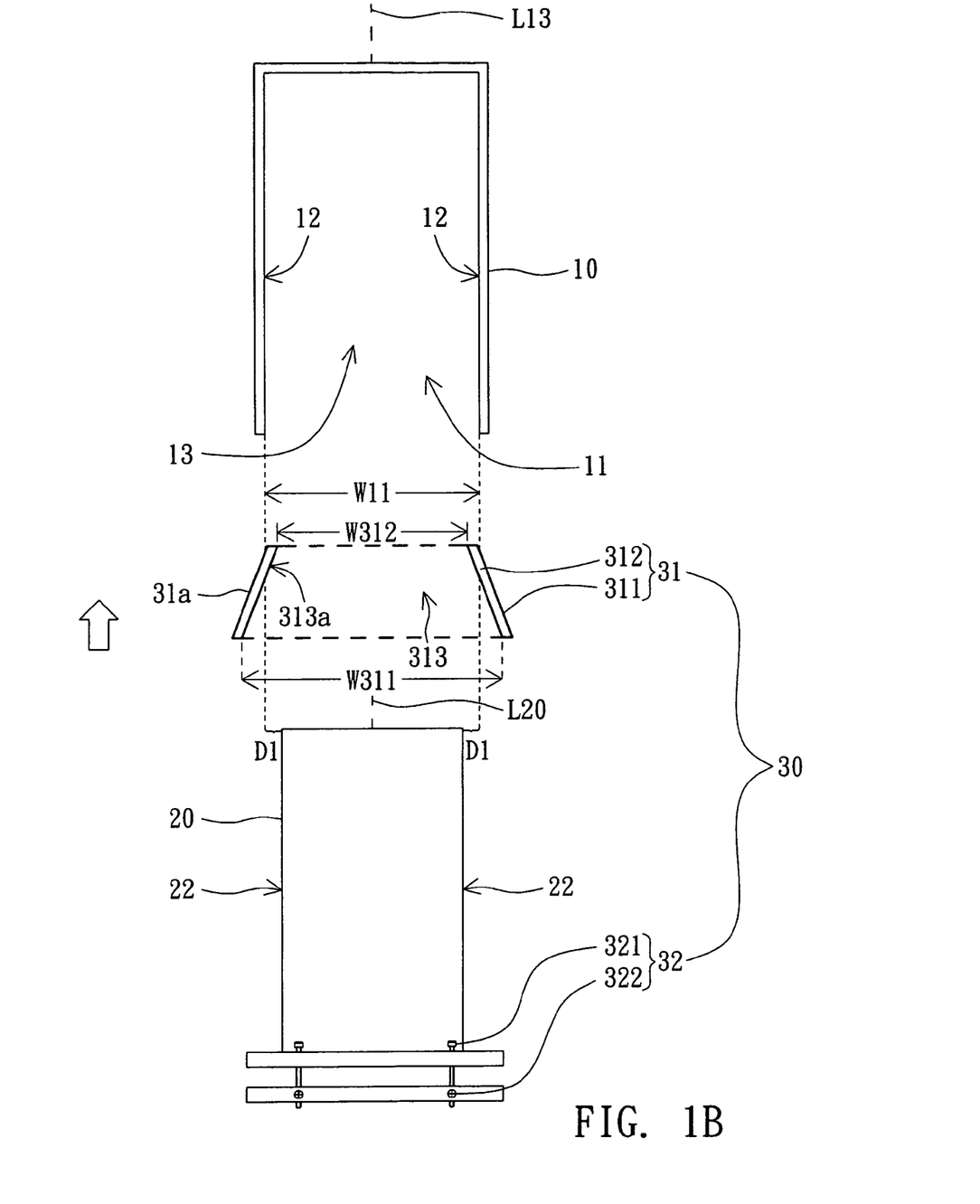
FIG. 1B is a schematic side view showing the adjusting mechanism, the furnace and the boat of FIG. 1A.

FIG. 1A is a pictorial view showing an adjusting mechanism, a furnace and a boat according to a preferred embodiment of the invention. FIG. 1B is a schematic side view showing the adjusting mechanism, the furnace and the boat of FIG. 1A. Referring to FIGS. 1A and 1B, the adjusting mechanism 30 adjusts a boat 20 in a furnace 10 to be parallel to the furnace 10. The furnace 10 has a receiving space 13 and an opening 11. The receiving space 13 has a first symmetrical line L13. The boat 20 has a second symmetrical line L20. The adjusting mechanism 30 includes an adjusting tool 31 and an adjusting element 32. The adjusting tool 31 is removably disposed at the opening 11 and has a wide part 311, a narrow part 312 and a through hole 313 formed from the wide part 311 to the narrow part 312. The adjusting tool 31 of FIG. 1B is located outside the opening 11. The narrow part 312 may block the opening 11 such that the wide part 311 is exposed out of the opening 11. The adjusting tool 31 can reduce the gap area between the boat 20 and the receiving space 13. Thus, using the adjusting element 32 can easily adjust the first symmetrical line L13 and the second symmetrical line L20 to be parallel to each other.

As shown in FIGS. 1A and 1B, the adjusting tool 31 of this embodiment is a hollow funnel-like structure. The width of the adjusting tool 31 gradually decreases from the wide part 311 to the narrow part 312. The width W312 of the narrow part 312 is smaller than the width W11 of the opening 11, and the width W311 of the wide part 311 is greater than the width W11 of the opening 11. As shown in FIG. 1B, a sidewall 313a of the through hole 313 is parallel to a sidewall 31a of the adjusting tool 31, and a profile of the sidewall 313a of the through hole 313 corresponds to a profile of the sidewall 31a of the adjusting tool 31.

Figure 1C:
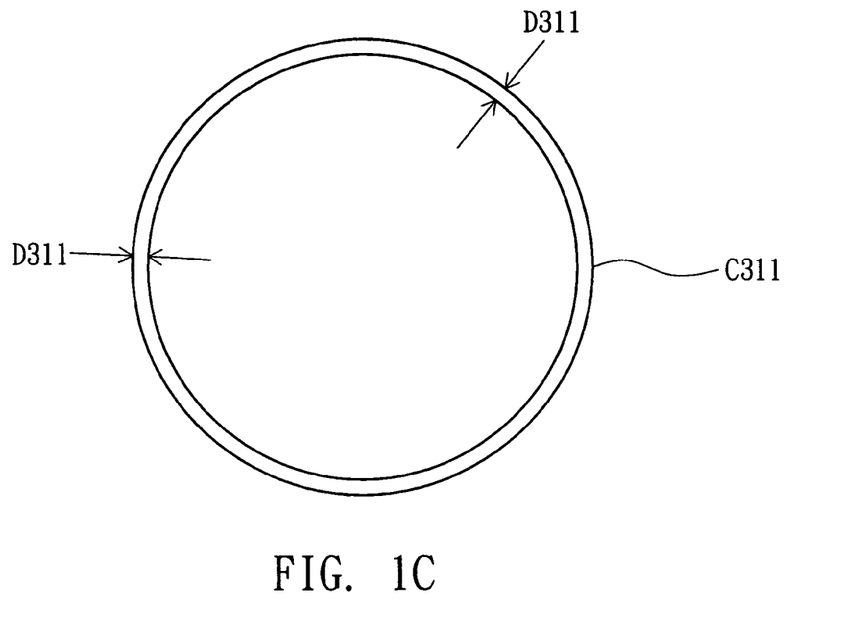
FIG. 1C is a cross-sectional view showing an adjusting tool taken along a line 1C-1C' of FIG. 1A.
Figure 1D:
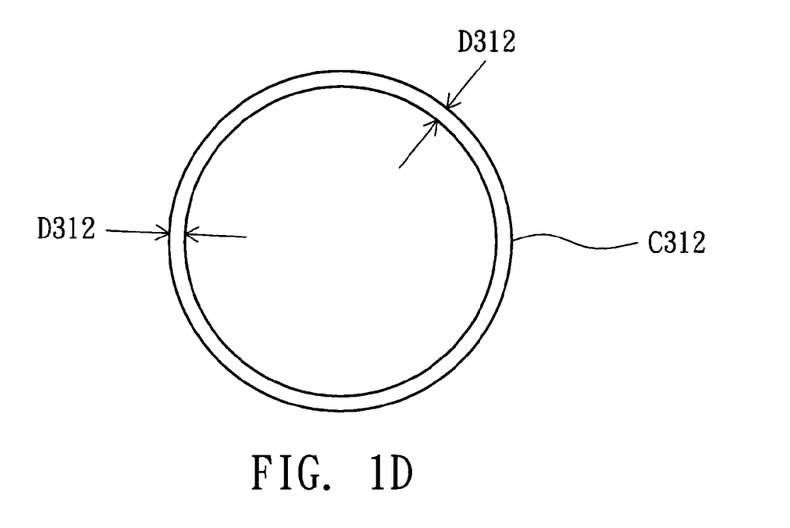
FIG. 1D is a cross-sectional view showing the adjusting tool taken along a line 1D-1D' of FIG. 1A.

FIG. 1C is a cross-sectional view showing an adjusting tool taken along a line 1C-1C' of FIG. 1A. FIG. 1D is a cross-sectional view showing the adjusting tool taken along a line 1D-1D' of FIG. 1A. As shown in FIG. 1C, the wide part 311 has a first annular cross section C311 perpendicular to the second symmetrical line L20. The first annular cross section C311 has substantially the same thickness in directions perpendicular to the second symmetrical line L20. As shown in FIG. 1D, the narrow part 312 has a second annular cross section C312 perpendicular to the second symmetrical line L20. The second annular cross section C312 has substantially the same thickness in directions perpendicular to the second symmetrical line L20. In fact, the opening 11 is a circular opening, the first annular cross section C311 is a first circular cross section and the second annular cross section C312 is a second circular cross section. Furthermore, the thickness D311 of the first annular cross section C311 substantially equals the thickness D312 of the second annular cross section C312.

Figure 2A:
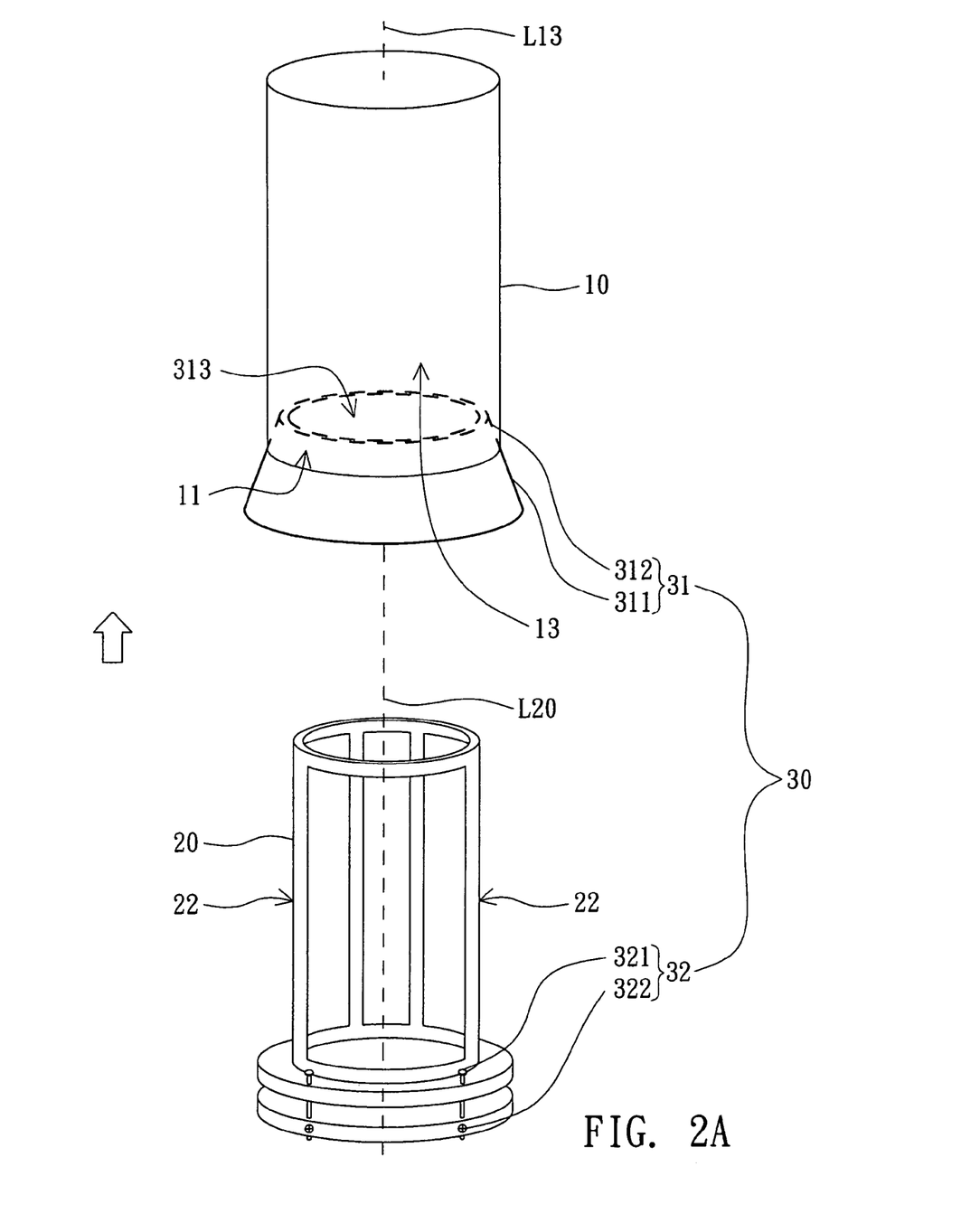
FIG. 2A is a pictorial view showing a state when the adjusting tool of FIG. 1A blocks an opening.
Figure 2B:
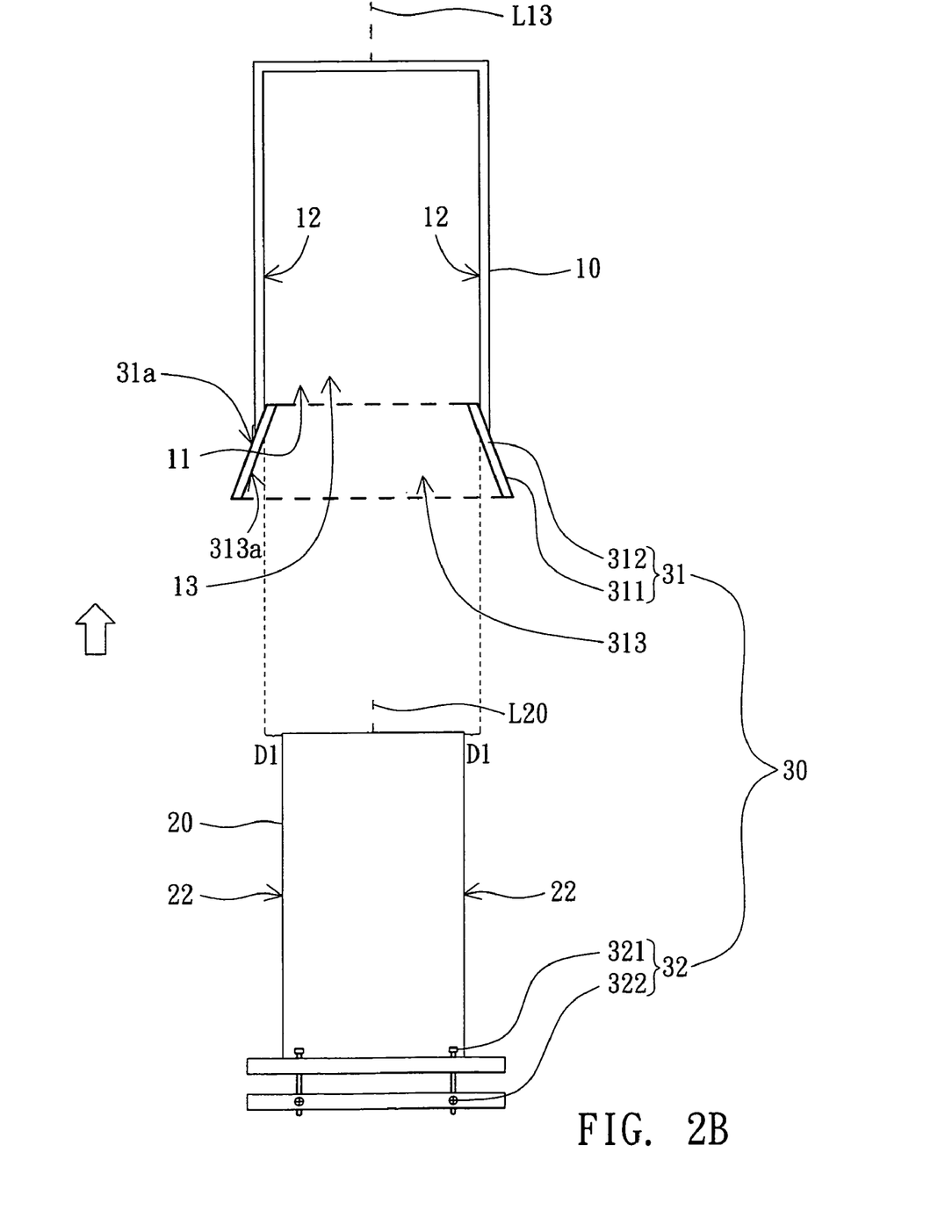
FIG. 2B is a schematic side view showing the adjusting mechanism, the furnace and the boat of FIG. 2A.

As shown in FIG. 2B, when the boat 20 is located outside the opening 11 of the furnace 10, a first gap area D1 is formed between a sidewall 22 of the boat 20 and an extension line of a sidewall 12 of the receiving space 13.

FIG. 2A is a pictorial view showing a state when the adjusting tool of FIG. 1A blocks an opening. FIG. 2B is a schematic side view showing the adjusting mechanism, the furnace and the boat of FIG. 2A. As shown in FIGS. 2A and 2B, when the adjusting tool 31 blocks the opening 11, the narrow part 312 is located inside the receiving space 13 and the wide part 311 is located outside the opening 11.

Figure 3A:
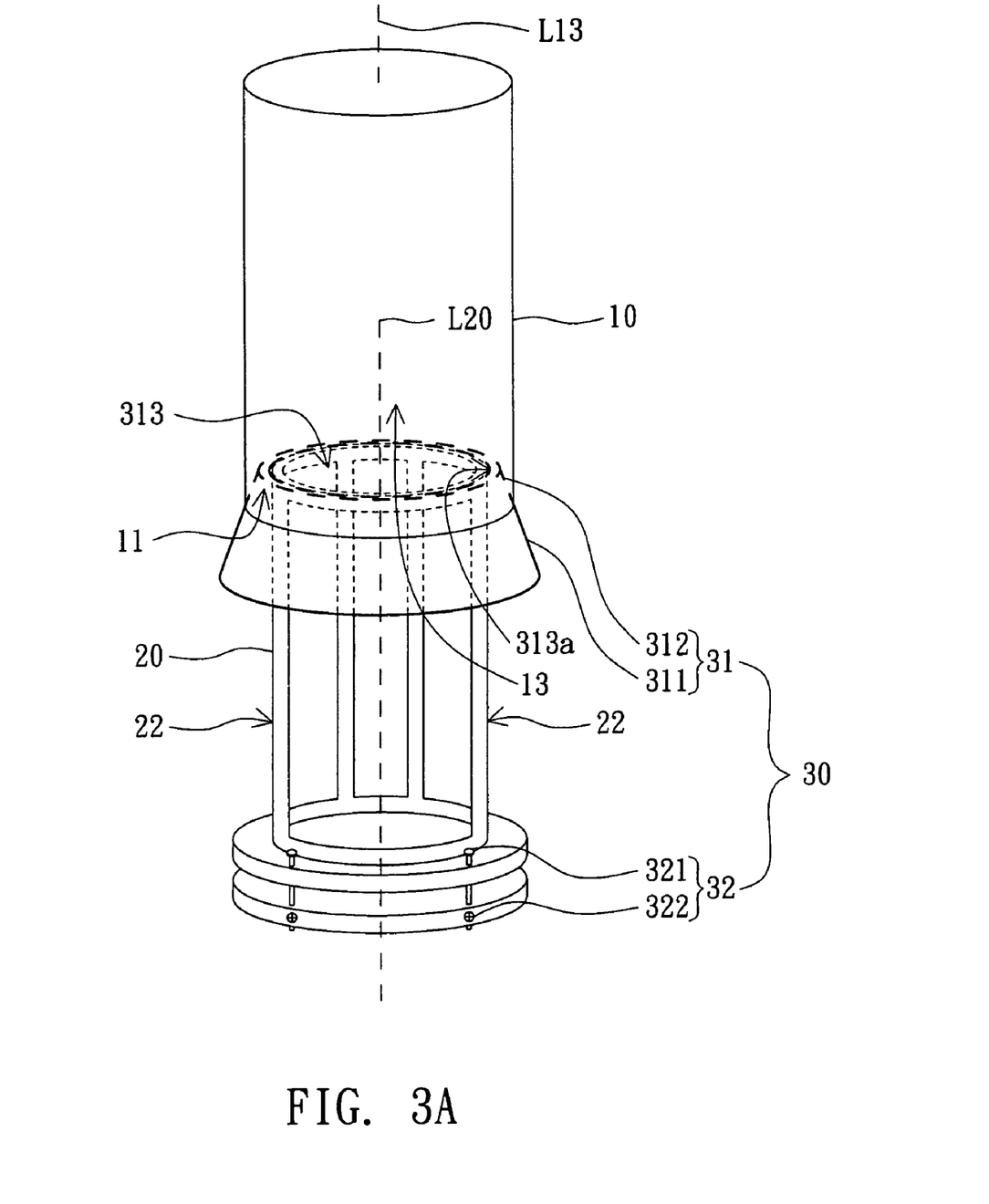
FIG. 3A is a pictorial view showing a state when the boat of FIG. 2A passes through the opening and a through hole.
Figure 3B:
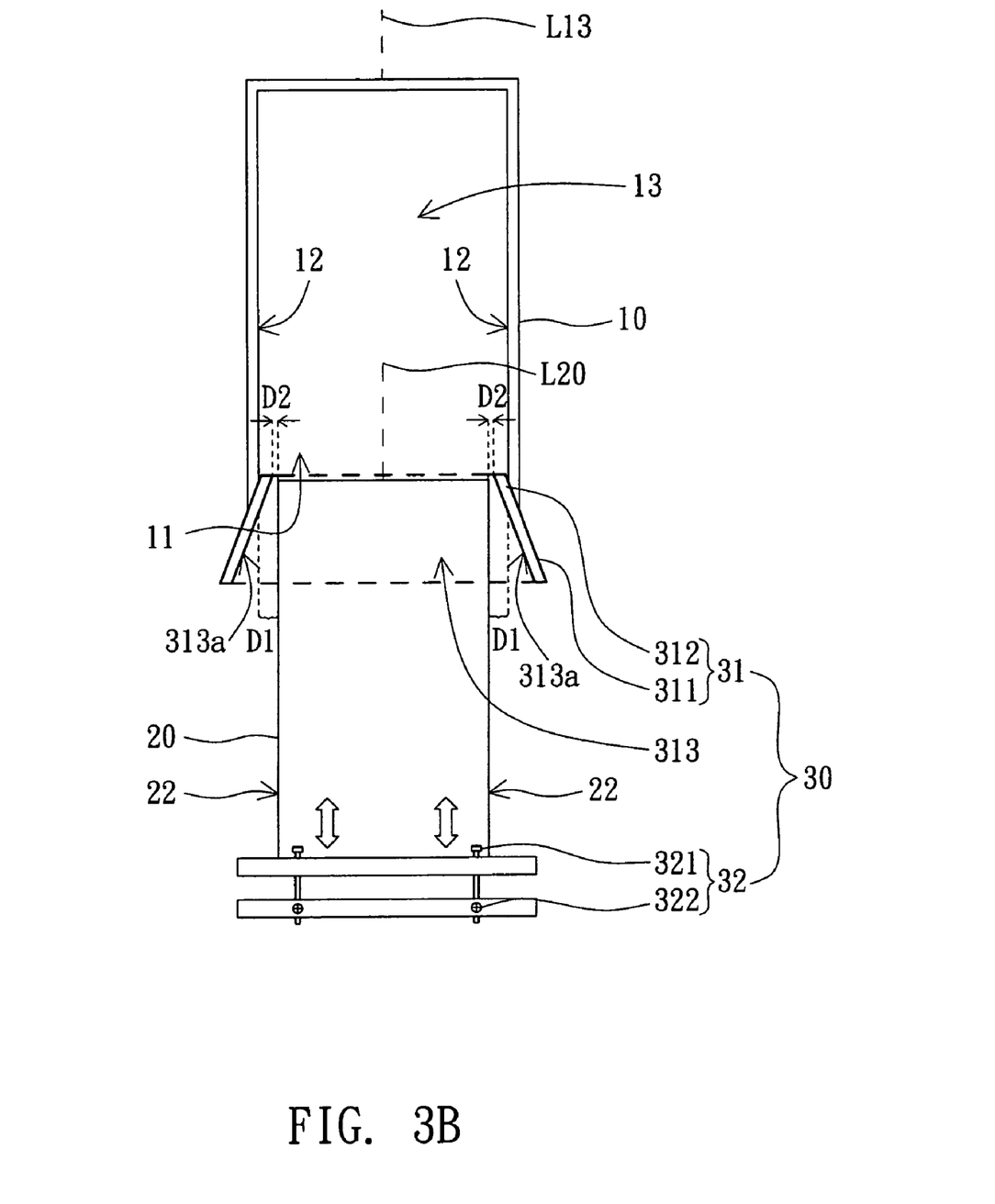
FIG. 3B is a schematic side view showing the adjusting mechanism, the furnace and the boat of FIG. 3A.
Figure 3C:
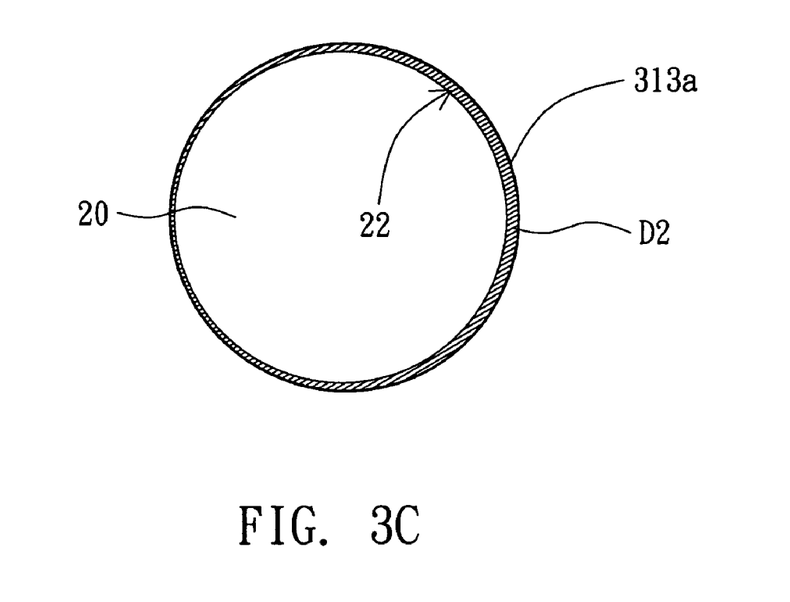
FIG. 3C is a schematic top view showing a sidewall of the boat, which is not parallel to a sidewall of the furnace of FIG. 3A.
Figure 3D:
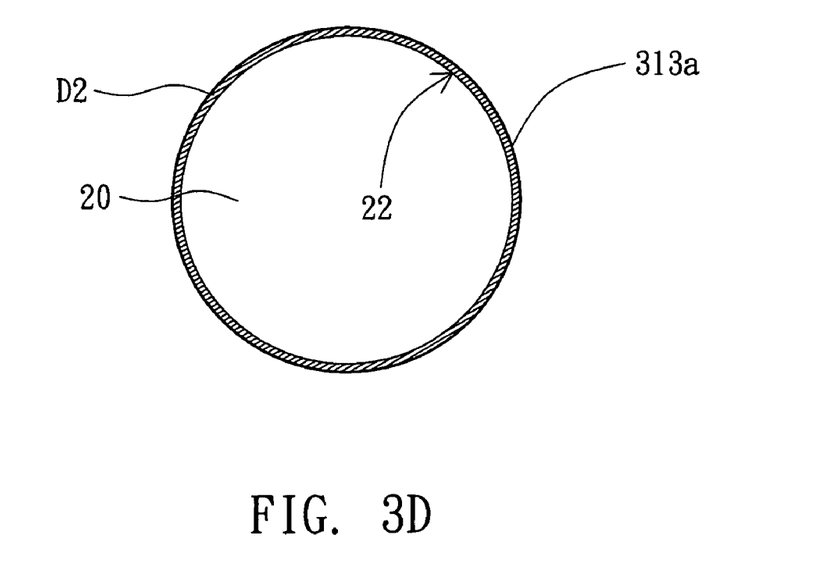
FIG. 3D is a schematic top view showing the sidewall of the boat and the sidewall of the furnace of FIG. 3C after the adjustment.

FIG. 3A is a pictorial view showing a state when the boat of FIG. 2A passes through the opening and a through hole. FIG. 3B is a schematic side view showing the adjusting mechanism, the furnace and the boat of FIG. 3A. FIG. 3C is a schematic top view showing the sidewall of the boat, which is not parallel to the sidewall of the furnace of FIG. 3A. FIG. 3D is a schematic top view showing the sidewall of the boat and the sidewall of the furnace of FIG. 3C after the adjustment. When the boat 20 is inserted into the receiving space 13 through the through hole 313 and the opening 11, a second gap area D2 smaller than the first gap area D1 is formed between the sidewall 22 of the boat 20 and the sidewall 313a of the through hole 313 at the narrow part 312. As shown in FIG. 3C, when the boat 20 tilts in the furnace 10, the second gap area D2 has different widths in various directions. The user can adjust the boat 20 according to the second gap area D2 and the adjusting element 32. The adjusting element 32 includes a moving part and a fixing part. In this embodiment, the moving part is a set screw 321, and the fixing part is a fixing screw 322. The user can rotate the set screw 321 to adjust the bevel of the boat 20 relative to the furnace 10, such that the second gap area D2 of FIG. 3C has the same width in various directions, as shown in FIG. 3D. When the second gap area D2 has the same width in all directions, the first symmetrical line L13 and the second symmetrical line L20 are parallel to each other. The fixing screw 322 can position the boat 20 to prevent the boat 20 from being biased after the adjustment.

Figure 4A:
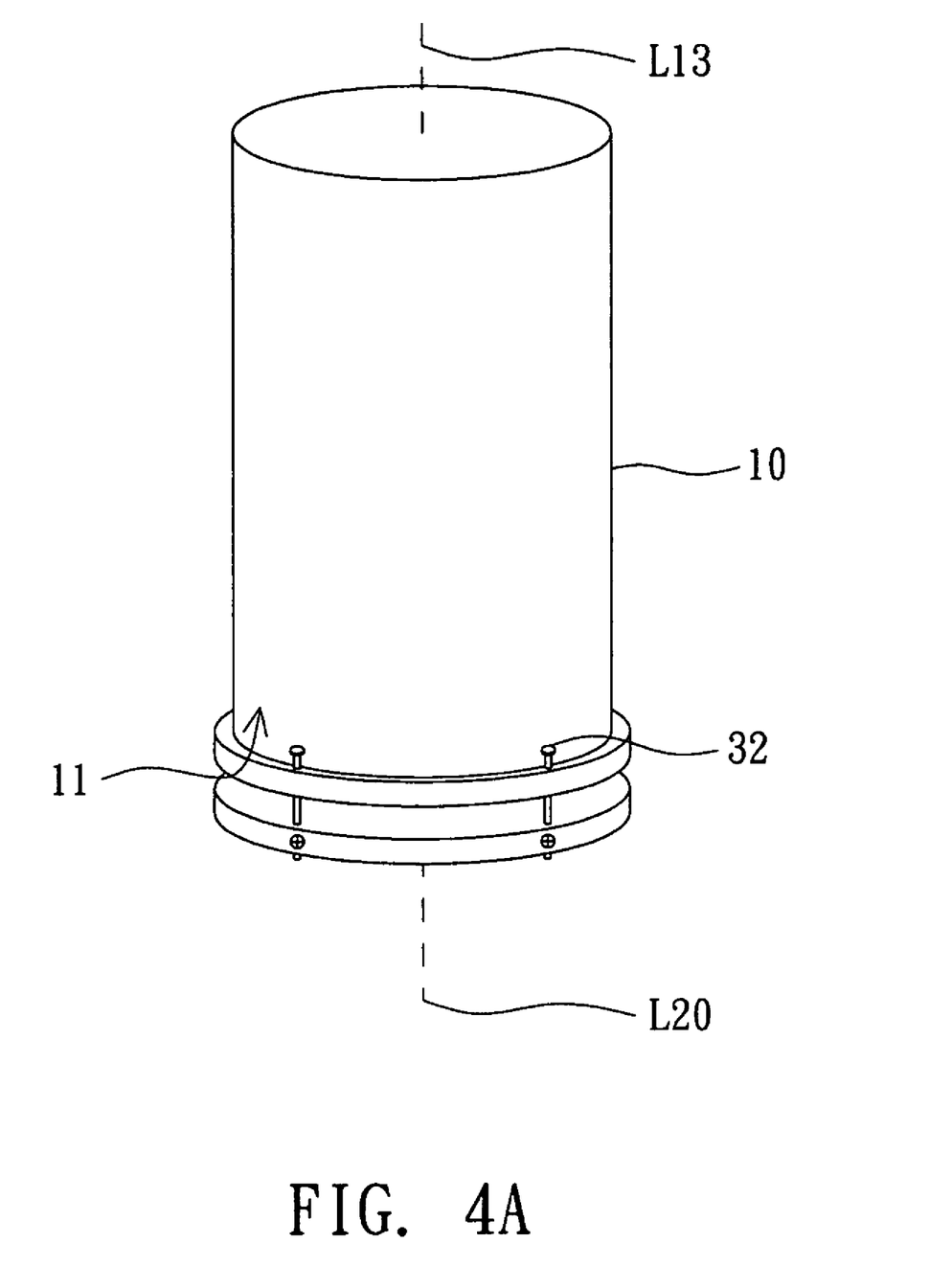
FIG. 4A is a pictorial view showing the boat and the furnace of FIG. 3A after the adjustment.
Figure 4B:
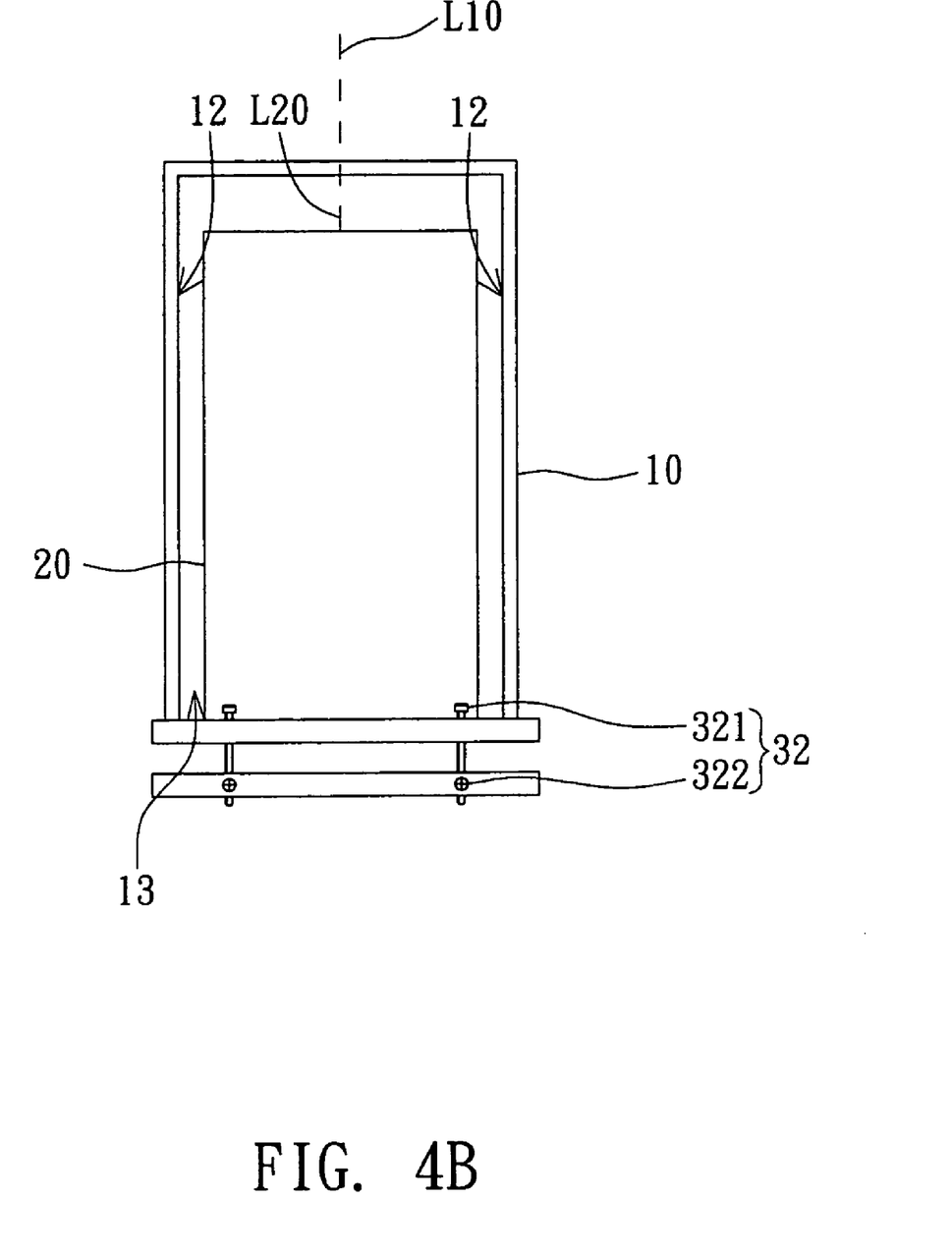
FIG. 4B is a schematic side view showing the adjusting element, the furnace and the boat of FIG. 4A.

FIG. 4A is a pictorial view showing the boat and the furnace of FIG. 3A after the adjustment. FIG. 4B is a schematic side view showing the adjusting element, the furnace and the boat of FIG. 4A. As shown in FIGS. 4A and 4B, the user detaches the adjusting tool 31 of FIG. 3A after the adjustment. At this time, the boat 20 after being adjusted is inserted into the receiving space 13 of the furnace 10. Because the first symmetrical line L13 is parallel to the second symmetrical line L20, no friction between the boat 20 and the sidewall 12 of the furnace 10 will occur.

Although the furnace of the above-mentioned embodiment is a vertical furnace, the furnace of the invention may also be a horizontal furnace. Any modification, which uses an adjusting tool to reduce the gap area between the boat and the furnace and thus to achieve the object of easily adjusting the boat in the furnace to be parallel to the furnace, may be regarded as falling within the scope of the invention.

Second Embodiment

Figure 5:
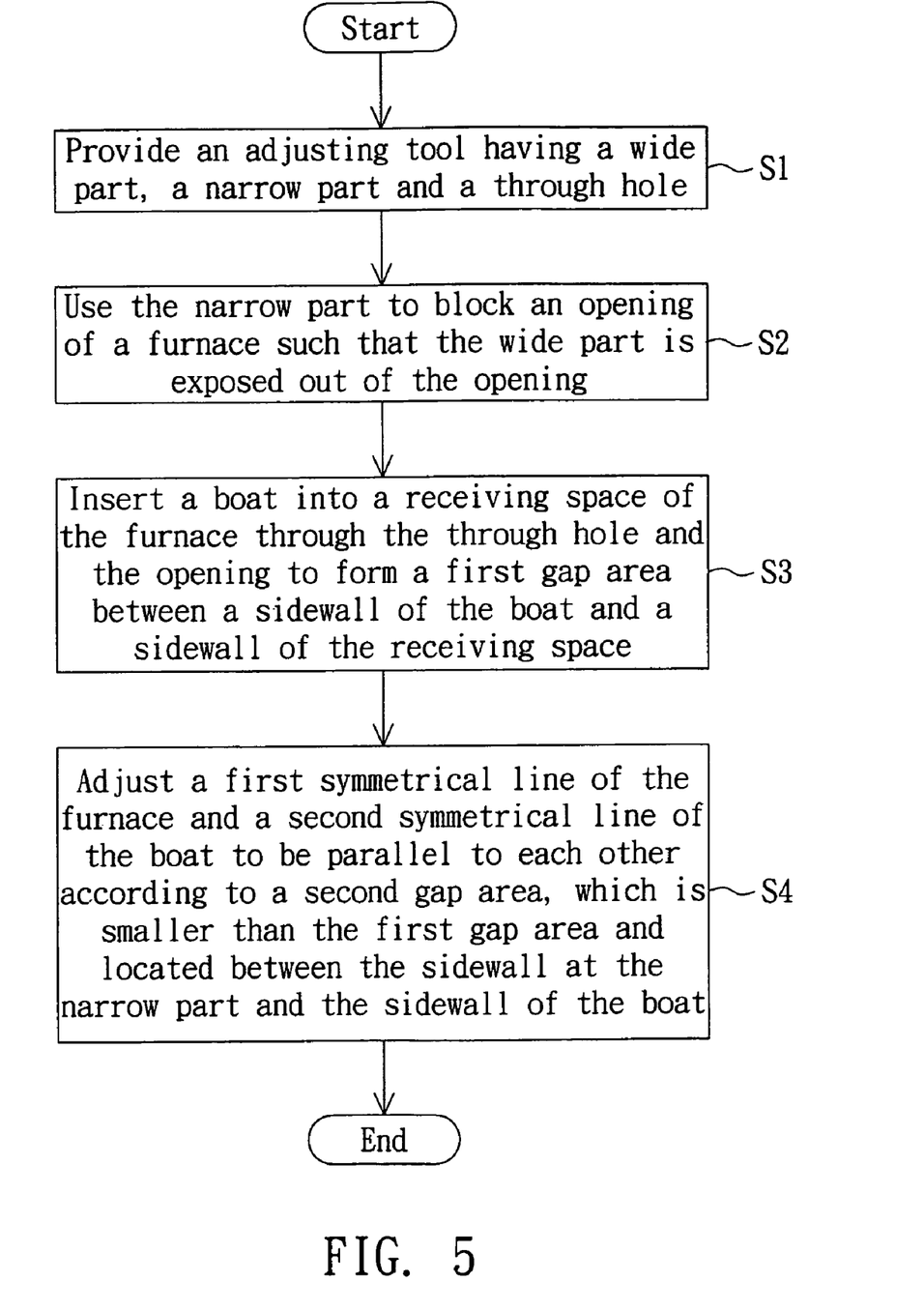
FIG. 5 is a flow chart showing an adjusting method according to the invention.

FIG. 5 is a flow chart showing an adjusting method according to a second embodiment of the invention. Herein, the adjusting mechanism may be the adjusting mechanism of the above-mentioned embodiment or the modification thereof. In this embodiment, descriptions are made according to the adjusting mechanism 30 of the first embodiment, and the structures of the furnace 10 and the boat 20 of the second embodiment are the same as those of the first embodiment. Thus, the same symbols are used in the second embodiment, and detailed descriptions of the symbols will be omitted.

As shown in FIGS. 5, 1A and 1B, an adjusting tool 31 is provided in step S1. The adjusting tool 31 has a wide part 311, a narrow part 312 and a through hole 313 formed from the wide part 311 to the narrow part 312.

In step S2, as shown in FIGS. 5, 2A and 2B, the narrow part 312 blocks the opening 11 such that the wide part 311 is exposed out of the opening 11.

In step S3, as shown in FIGS. 5, 3A and 3B, the boat 20 is inserted into the receiving space 13 through the through hole 313 and the opening 11. A second gap area D2 smaller than the first gap area D1 is formed between the sidewall 22 of the boat 20 and the sidewall 313a of the through hole 313 at the narrow part 312.

Next, step S4 adjusts the first symmetrical line L13 and the second symmetrical line L20 to be parallel to each other according to the second gap area D2.

In step S4, the furnace 10 can be fixed while the boat 20 is adjusted such that the second gap D2 of FIG. 3C has the same width in all directions, as shown in FIG. 3D. When the second gap area D2 has the same width in all directions, the first symmetrical line L13 and the second symmetrical line L20 are parallel to each other. In addition, the boat 20 can be fixed after the adjustment, and then the adjusting tool 31 may be detached.

The adjusting mechanism and the adjusting method thereof according to the embodiments of the invention utilize an adjusting tool to reduce the gap area between the boat and the furnace. Thus, it is easier to adjust the boat in the furnace to be parallel to the furnace according to the gap area between the boat and the furnace. Consequently, it is possible to prevent the boat from colliding with the furnace when the boat is rotated or moved into and out of the furnace, and thus prevent the boat or the furnace from being damaged and prevent the particles, which contaminate the wafer and cause defects in the wafer, from being produced at the collision.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An adjusting mechanism for adjusting a boat in a furnace to be parallel to the furnace, the furnace having a receiving space and an opening, the receiving space having a first symmetrical line, the boat having a second symmetrical line, a first gap area being formed between a sidewall of the receiving space and a sidewall of the boat when the boat is inserted into the receiving space through the opening, the adjusting mechanism comprising:

an adjusting tool, which is removably disposed at the opening and has a wide part, a narrow part and a through hole formed from the wide part to the narrow part, wherein the narrow part inserts into the opening such that the wide part is exposed out of the opening, and a second gap area smaller than the first gap area is formed between a sidewall of the through hole at the narrow part and the sidewall of the boat when the boat is inserted into the receiving space through the through hole and the opening; and an adjusting element for adjusting the first symmetrical line and the second symmetrical line to be parallel to each other according to the second gap area;

wherein, the sidewall of the boat has a first diameter, the sidewall of the through hole at the narrow part has a second diameter, the sidewall of the receiving space has a third diameter, the first diameter is smaller than the second diameter, and the second diameter is smaller than the third diameter.

2. The adjusting mechanism according to claim 1, wherein the wide part and the narrow part form a one-piece molded structure.

3. The adjusting mechanism according to claim 1, wherein the adjusting tool has a hollow funnel-like structure, a width of the adjusting tool gradually decreases from the wide part to the narrow part, a width of the narrow part is smaller than a width of the opening, and a width of the wide part is greater than the width of the opening.

4. The adjusting mechanism according to claim 3, wherein the sidewall of the through hole is parallel to a sidewall of the adjusting tool, and a profile of the sidewall of the through hole corresponds to a profile of the sidewall of the adjusting tool.

5. The adjusting mechanism according to claim 1, wherein the wide part has a first annular cross section perpendicular to the second symmetrical line, the narrow part has a second annular cross section perpendicular to the second symmetrical line, and a thickness of the first annular cross section substantially equals a thickness of the second annular cross section.

6. The adjusting mechanism according to claim 5, wherein the first annular cross section has substantially the same thickness in directions perpendicular to the second symmetrical line.

7. The adjusting mechanism according to claim 5, wherein the second annular cross section has substantially the same thickness in directions perpendicular to the second symmetrical line.

8. The adjusting mechanism according to claim 5, wherein the opening is a circular opening, the first annular cross section is a first circular cross section and the second annular cross section is a second circular cross section.

9. The adjusting mechanism according to claim 1, wherein the adjusting element comprises:

a moving part for moving the boat; and a fixing part for positioning the boat, wherein the fixing part fixes the boat after the moving part moves the boat to a position, in which the first symmetrical line and the second symmetrical line are parallel to each other.

10. The adjusting mechanism according to claim 9, wherein the moving part is a set screw and the fixing part is a fixing screw.

* * * * *